US009804629B1

(12) United States Patent
Tanase

(10) Patent No.: US 9,804,629 B1
(45) Date of Patent: Oct. 31, 2017

(54) METHOD AND APPARATUS FOR CURRENT SENSING AND MEASUREMENT

(71) Applicant: Maxim Integrated Products, Inc., San Jose, CA (US)

(72) Inventor: Gabriel E. Tanase, Cupertino, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/949,855

(22) Filed: Nov. 23, 2015

Related U.S. Application Data

(62) Division of application No. 13/827,181, filed on Mar. 14, 2013, now Pat. No. 9,195,252.

(51) Int. Cl.
*H03F 3/04* (2006.01)
*G05F 3/26* (2006.01)

(52) U.S. Cl.
CPC .................................... *G05F 3/262* (2013.01)

(58) Field of Classification Search
CPC ... G05F 3/18; G05F 3/30; G05F 3/262; G05F 3/073; G05F 3/205; H03L 7/18; H03L 7/0895; H03K 5/08; H03K 5/1252
USPC ......... 323/311–317; 327/148, 157, 536–543, 327/310, 313, 551
See application file for complete search history.

(56) References Cited

U.S. PATENT DOCUMENTS 5,504,444 A * 4/1996 Neugebauer ............ H03F 3/005 323/315

* cited by examiner

*Primary Examiner* — Nguyen Tran
(74) *Attorney, Agent, or Firm* — TIPS Group

(57) ABSTRACT

A method and apparatus for current sensing and measurement employs two cascaded MOSFET current mirrors, wherein the mirrored current leaving the first current mirror is fed to the input of the second current mirror. Each current mirror contains a high current MOSFET and a low current MOSFET, connected source-to-source and gate-to-gate. The MOSFETs are matched so that drain-to-source current flowing in the high current MOSFET is proportional to the drain-to-source current flowing in the low current MOSFET. The ratio of high current to low current for each current mirror is M, where M is 100 or less. Voltage biasing networks are employed to maintain constant drain-to-source voltages for both MOSFETs in each current mirror.

5 Claims, 4 Drawing Sheets

METHOD AND APPARATUS FOR CURRENT SENSING AND MEASUREMENT

CROSS REFERENCE TO RELATED APPLICATIONS

This application is a division of U.S. Ser. No. 13/827,181, filed Mar. 14, 2013, now U.S. Pat. No. 9,195,252, which is incorporated herein by reference.

BACKGROUND

Electronic current sensing and measurement is utilized in a wide variety of electronic devices. Current sensing and measurement methods and devices can be divided into two basic modes, voltage-based (indirect) and current-based (direct).

FIG. 1 is a simplified schematic of a typical voltage-based current sensing and measurement circuit 100. A current measurement resistor $R_m$ 102 is placed in series with a load (not shown) in which the current is to be measured. A differential amplifier 104 is utilized to measure the voltage drop across $R_m$ and the current is computed from the measured voltage drop and the known value of $R_m$.

This technique described above with respect to voltage-based current sensing and measurement circuit 100 has a number of drawbacks for measurement of large currents or current ranges having a large dynamic range (e.g., the range of the smallest current to be measured to the largest current to be measured). For large currents (e.g. on the order of several amperes) $R_m$ needs to be as small as possible to minimize parasitic voltage drop and dissipated power. Manufacturing very low resistance values accurately is very difficult and expensive, however, particularly if it must be integrated on a monolithic integrated circuit. For very small currents, the limit of measurement will be determined by the D.C. parameters of differential amplifier 104, particularly the amplifier's offset voltage and, to a lesser extent, the input offset currents. As a result, the dynamic range will be limited to three or four orders of magnitude.

Current-based current sensing and measurement apparatus typically rely on what is commonly known as a "current" mirror. FIG. 2 is a simplified schematic 200 of a bipolar current mirror 200 that uses matched transistors to create an "image" current, or scaled replica, of the current to be measured, $I_{in}$. With bipolar current mirror 200, the current to be measured flows through "n" matched transistors 204, all having common emitter, base, and collector connections. Although three transistors 204 are illustrated in FIG. 2, n can be any number. Matching of the emitter base voltage characteristics assures that the current to be measured is equally shared by all the transistors 204. With the bipolar current mirror 200, an additional matched transistor 202 sharing the emitter and base connections of transistors 204 is employed to create the mirrored current $I_m$, which is approximately 1/n of the current $I_{in}$.

One major drawback of bipolar current mirroring is excessive power dissipation at high current values. Since the typical emitter-base voltages for bipolar transistors are on the order of 0.6 to 0.7 volts, a current level of, for example, 1 ampere will result in a power dissipation of 600 to 700 mW. This high power dissipation creates difficulties for monolithic circuitry (e.g. integrated circuits), requiring expensive packaging, large dies sizes, and perhaps external heat sinking. As a result, current limits for bipolar current mirrors are typically no more than about 10 mA.

U.S. Pat. No. 6,888,401, incorporated herein by reference, describes a MOSFET-technology current mirror. FIG. 3 is a schematic of a MOSFET current mirror 300 utilizing matched MOSFETs (metal oxide semiconductor field effect transistors) 302 and 304 as described therein. The current $I_{in}$ to be measured flows through MOSFET 302, which is designed to handle M times the current of MOSFET 304, at the same gate-to-source voltage. Thus, a current $I_{in}$ flowing through MOSFET 302 induces a mirror current $I_m=I_{in}/M$ in MOSFET 304.

In FIG. 3, operational amplifier 308, in conjunction with bias control block 312, sets the output voltage of the MOSFET current mirror 300 by biasing the gate voltage of MOSFETs 302 and 304 such that the drain-to-source voltage of MOSFET 302 remains constant. This assures minimum power dissipation while keeping MOSFET 302 in linear operation. Operational amplifier ("op-amp") 310 and MOSFET 306 keep the drain-to-source voltages of MOSFETs 302 and 304 equal to each other, within the error of the input offset voltage of op-amp 310. This assures tight matching of MOSFETs and reduces errors that may result if the drain-to-source voltages are allowed to vary.

While the performance of the circuit of FIG. 3 is an improvement over the voltage-based version of FIG. 1 and the bipolar current mirror of FIG. 2, it still exhibits a degree of inaccuracy at large M values of about 1000 or greater. For these large M values, accuracy is typically limited to 8-10%, primarily due to monolithic circuit layout issues which affect the matching of MOSFETs 302 and 304, proximity effects, interconnect resistance, and package stress.

Improvements in the accuracy of the MOSFET current mirror shown in FIG. 3 can be made if the gain M can be reduced. At reduced gains, the matching of MOSFETs 302 and 304 can be more precise, and the current measurement accuracy can be significantly improved. However, reducing M can create other problems, particularly when trying to measure currents on the order of a few amperes.

These and other limitations of the prior art will become apparent to those of skill in the art upon a reading of the following descriptions and a study of the several figures of the drawing.

SUMMARY

In an embodiment, set forth by way of example and not limitation, an electrical current sensing and measurement apparatus includes a first current mirror having an input terminal, a high current output terminal, and a mirrored current output terminal, and a second current mirror having an input terminal, a high current output terminal, and a mirrored current output terminal, wherein the mirrored current output terminal of the first current mirror is connected to the input terminal of the second current mirror.

In another embodiment, set forth by way of example and not limitation, an electrical current sensing and measurement apparatus includes a first current mirror having an input terminal, a high current output terminal, and a mirrored current output terminal, a second current mirror having an input terminal, a high current output terminal, and a mirrored current output terminal, and a third current mirror having an input terminal, a high current output terminal, and a mirrored current output terminal, wherein the mirrored current output terminal of the first current mirror is connected to the input terminal of the second current mirror, and the mirrored current output terminal of the second current mirror is connected to the input terminal of the third current mirror.

In another embodiment, set forth by way of example and not limitation, a method for measuring electrical current includes providing a first current mirror having an input terminal, a high current output terminal, and a mirrored current output terminal, providing a second current mirror having an input terminal, a high current output terminal, and a mirrored current output terminal, and feeding an electrical current leaving the mirrored current output terminal of the first current mirror to the input terminal of the second current mirror.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Figure 1:
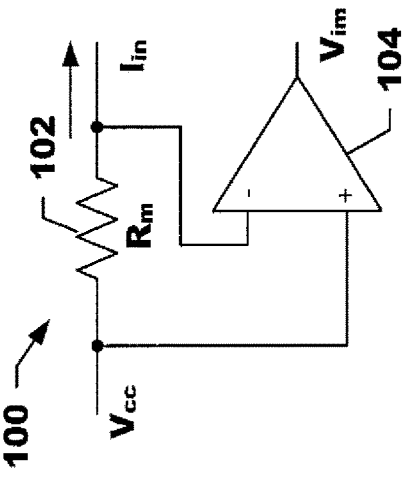
Figure 1 (Prior Art)
FIG. 1 is a schematic diagram of a typical voltage-based current measurement circuit.
Figure 2:
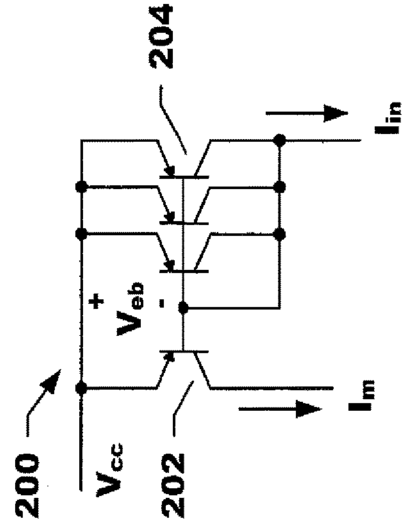
Figure 2 (Prior Art)
FIG. 2 is a schematic diagram of a typical current-based current measurement circuit incorporating bipolar transistors.
Figure 3:
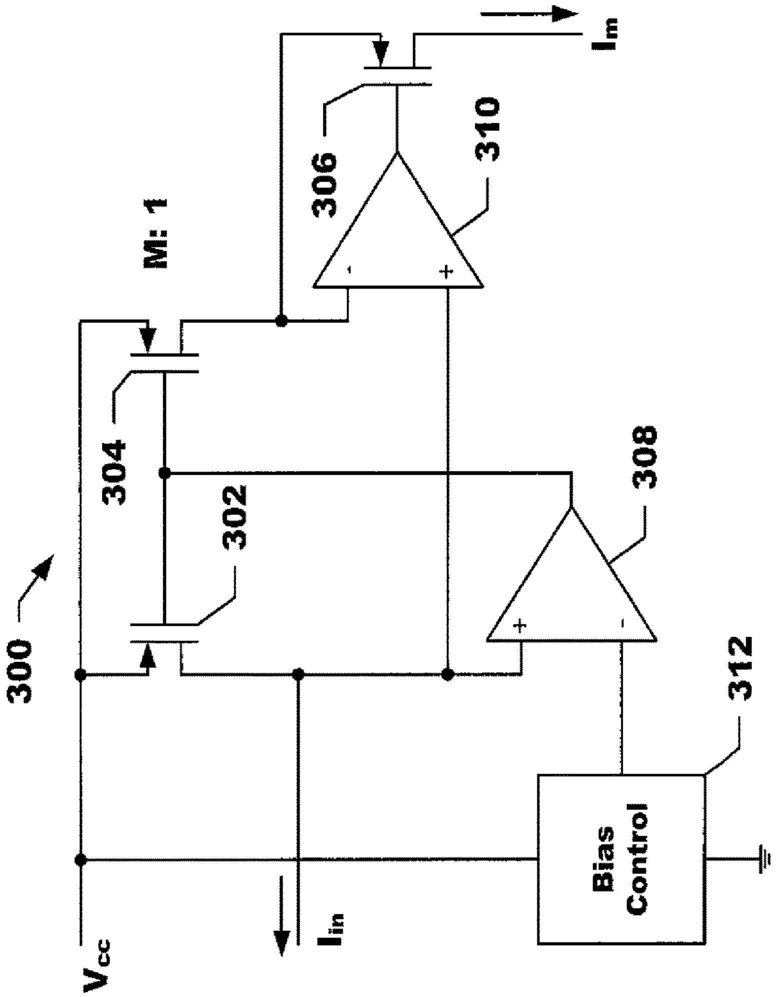
Figure 3 (Prior Art)
FIG. 3 is a schematic diagram of a prior art current-based measurement circuit incorporating MOSFET technology.
Figure 4:
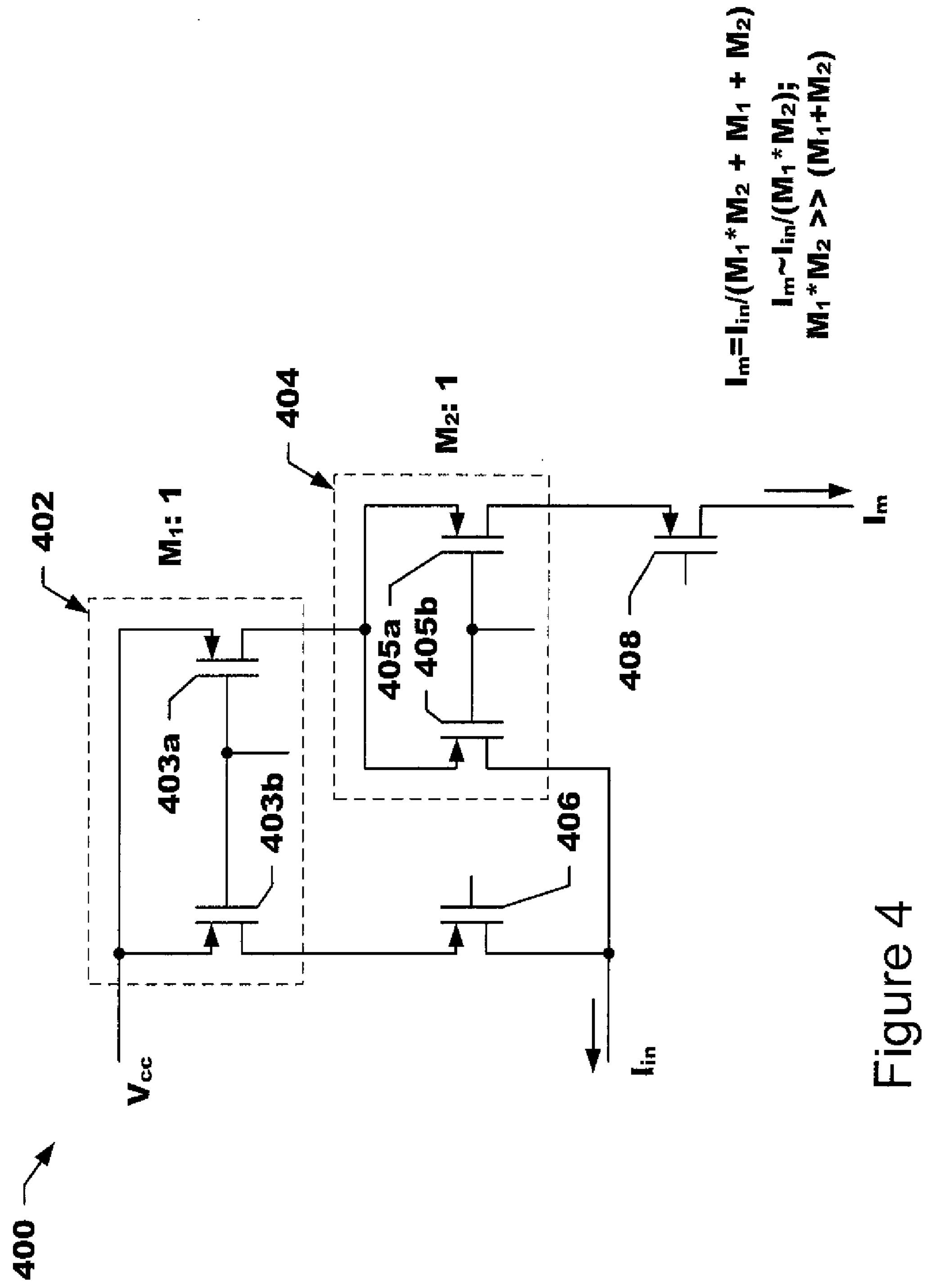
FIG. 4 is a schematic diagram of a current sensing and measurement apparatus incorporating two cascaded MOSFET current mirrors.

FIGS. 1-3 were discussed with reference to the prior art. FIG. 4 is a schematic diagram of a current sensing and measurement apparatus 400 incorporating two cascaded MOSFET current mirrors 402 and 404.

Current mirror 402 includes a MOSFET 403*a* and a MOSFET 403*b*, connected gate-to-gate and source-to-source. Current mirror 402 input terminal is connected to the two source terminals of MOSFET 403*a* and MOSFET 403*b*. Current mirror 402 has a high current output terminal connected to the drain connection of high current MOSFET 403*b*, and a mirrored current output terminal connected to the drain of low current MOSFET 403*a*. The gain factor $M_1$ is the ratio of the high current output at the drain of MOSFET 403*b* to the mirrored current output at the drain of MOSFET 403*a*. A voltage bias or control may be applied to the common gate connection of MOSFET 403*a* and MOSFET 403*b*.

Current mirror 404 includes a MOSFET 405*a* and a MOSFET 405*b*. Current mirror 404 input terminal is connected to the source terminals of MOSFET 405*a* and MOSFET 405*b*. Current mirror 404 has a high current output terminal connected to the drain connection of high current MOSFET 405*b*, and a mirrored current output terminal connected to the drain of low current MOSFET 405*a*. The gain factor $M_2$ is the ratio of the high current output at the drain of MOSFET 405*b* to the mirrored current output at the drain of MOSFET 405*a*. A voltage bias or control may be applied to the common gate connection of MOSFET 405*a* and MOSFET 405*b*.

Since the mirrored current leaving current mirror 402 is fed to second current mirror 404, the mirrored current $I_m$, leaving current mirror 404 will be reduced by approximately the product of both current mirror gains, or about $M_1 \times M_2$, compared to the current to be measured ($I_{in}$). The gain factor is given by:

$$I_m = I_{in}(M_1 * M_2 + M_1 + M_2);\ \text{typically}\ M_1 * M_2 >> M_1 + M_2$$

Since both $M_1$ and $M_2$ are much less than M for the single stage current mirror of FIG. 3 (for an equivalent overall gain), the accuracies of $M_1$ and $M_2$ are significantly better than that of M. As an example, a gain value M of 1000 may typically have a precision of 8-10%. For an overall gain of 1000, the dual stage cascaded current mirrors would require $M_1 = M_2 = \sqrt{M} \sim 32$. At lower $M_1$ and $M_2$ values the current measurement accuracy can attain precisions of 1-2% or better.

Returning to FIG. 4, MOSFET 406 provides a current path for the measured current leaving the first current mirror 402. It also maintains a voltage drop across the drain-to-source for MOSFET 405*a* and MOSFET 405*b* in the second current mirror 404. MOSFET 408 is part of a regulator that maintains the drain-to-source voltages for MOSFET 405*a* and MOSFET 405*b* at the same level and serves a similar function as MOSFET 306 of FIG. 3.

The principles illustrated by the dual stage cascaded current mirrors of FIG. 4 can be extended to any number of additional stages. The actual number of stages one may wish to employ will be determined more by practical matters such as circuit complexity, voltage drop, power dissipation, and diminishing returns with respect to overall current measurement accuracy. However, it may be evident that two stages provide sufficient accuracy for many applications, since there is a significant improvement in measurement accuracy between M factors of 1000 or greater and M factors on the order of 50-100.

Figure 5:
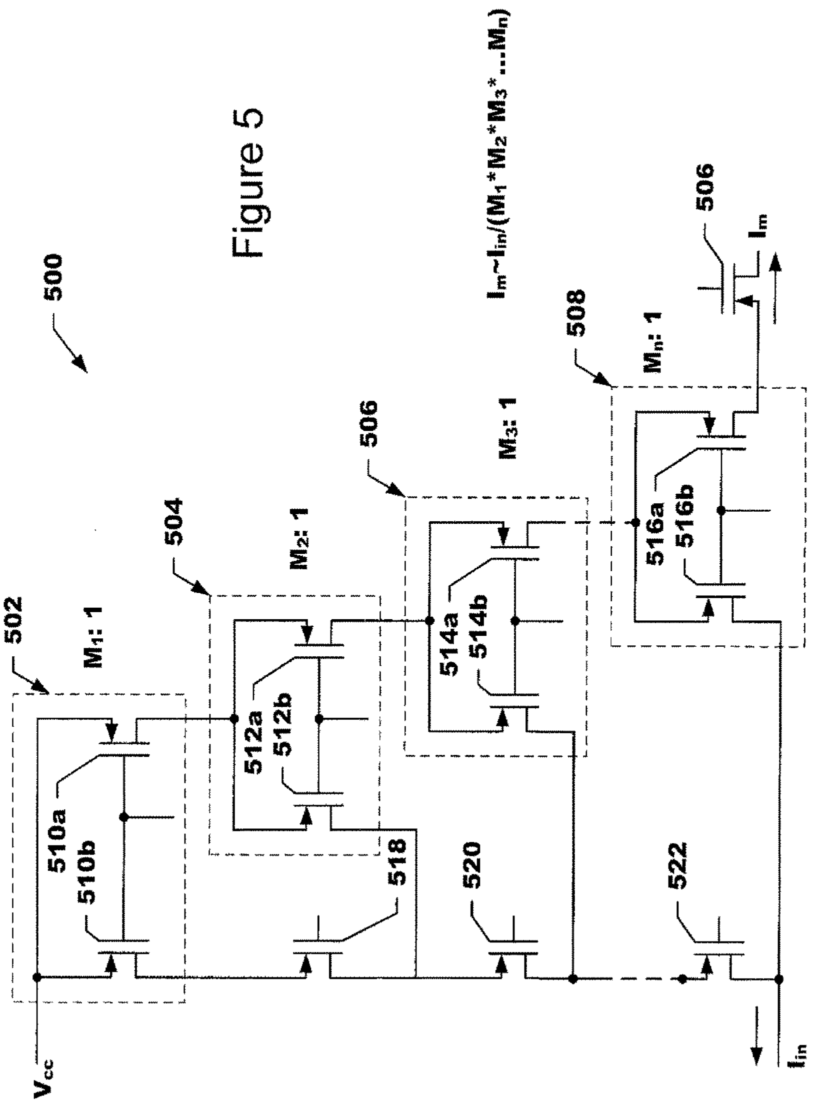
FIG. 5 is a schematic diagram of a current sensing and measurement apparatus incorporating "n" cascaded MOSFET current mirrors.

FIG. 5 is a schematic diagram of a current sensing and measurement apparatus 500 incorporating "n" cascaded MOSFET current mirrors. A first stage current mirror 502, having a MOSFET 510*a* and a MOSFET 510*b* and a current gain factor of $M_1$, provides its mirror current to second stage current mirror 504. Second stage current mirror 504, incorporating a MOSFET 512*a* and a MOSFET 512*b*, has a gain factor of $M_2$ and provides its mirror current to third stage current mirror 506. Third stage current mirror 506 is composed of MOSFET 514*a* and MOSFET 514*b*, having a current gain factor of $M_3$. The pattern continues to the $n^{th}$ stage current mirror 508, composed of MOSFET 516*a* and MOSFET 516*b*, with a gain factor of $M_n$. MOSFETs 518, 520, and 522 provide current return paths for measurement currents leaving each of the stages, while also providing voltage regulation to keep the appropriate current mirror drain-to-source voltages at a suitable level. MOSFET 506 serves a similar purpose as MOSFET 408 of FIG. 4. To a first order approximation, the gain factor of all n stages will be approximately the product of all the individual stage gains, so that each stage can provide a relatively low gain for improved overall system accuracy.

Figure 6:
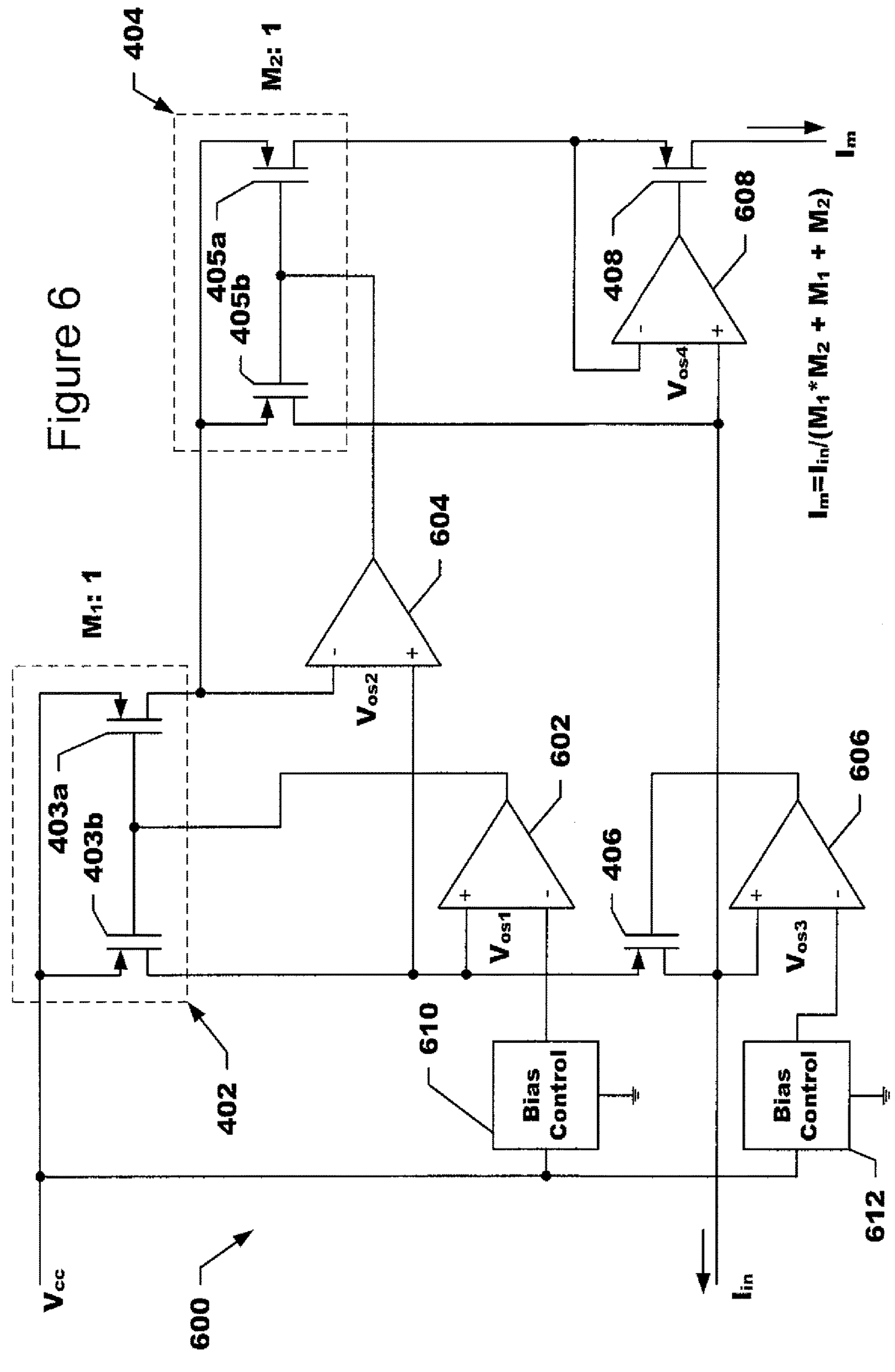
FIG. 6 is a schematic diagram of a current sensing and measurement apparatus incorporating two cascaded MOSFET current mirrors.

FIG. 6 is a schematic diagram of a current sensing and measurement apparatus 600 incorporating two cascaded MOSFET current mirrors and which operates in a similar manner to current sensing and measurement apparatus 400 of FIG. 4. Components of current sensing and measurement apparatus 600 that are analogous to components of current sensing and measurement apparatus 400 will use the same reference numbers and will not be discussed again in detail for the sake of brevity.

Bias regulation of a current mirror 402 of FIG. 6 is provided by an operational amplifier ("op-amp") 602 and a bias control regulator 610 (which serves as a voltage source). Assuming op-amp 602 is ideal, and $V_{os1}$ is zero, op-amp 602 will provide a gate voltage to MOSFET 403*a* and MOSFET 403*b* such that the drain voltage of MOSFET 403*b* (the high current output of current mirror 402) is equal to the bias control voltage from regulator 610 at the inverting input of op-amp 602. For real op-amps, $V_{os1}$ will be finite but in the order of a millivolt or less for high quality amplifiers.

Bias regulation of a current mirror 404 of FIG. 6 is provided by an op-amp 606 and a bias control regulator 612. By adjustment of the voltage drop across a MOSFET 406 of FIG. 6, an op-amp 606 maintains the voltage at its non inverting terminal, which is also the drain voltage of a MOSFET 405*b* in current mirror 404 (the high current output of current mirror 404), equal to the voltage at its inverting terminal (within any error offset voltage $V_{os3}$). A voltage at the inverting terminal of op-amp 606 is also the output voltage of bias regulator 612.

In the current sensing and measurement apparatus of FIG. 6, the drain-to-source voltage of the MOSFETs in current mirror 402 is determined by difference between $V_{cc}$ and the bias voltage from regulator 610, and the drain-to-source voltage of the MOSFETs in current mirror 404 is determined by the difference between the bias voltage from regulator 610 and the bias voltage from regulator 612.

To maintain high current measurement accuracy, it is important to keep the drain-to-source voltages for both MOSFETs in the current mirror at the same potential. The biasing circuits above keep the drain-to-source voltages of the high current MOSFET in each pair fixed (e.g. MOSFET 403*b* and MOSFET 405*b*). The remaining two amplifiers keep the drain voltages of both MOSFETs in each mirror at the same potential. The net effect of these two regulation systems is to keep the drain-to-source voltages of each MOSFET in a current mirror regulated at a constant voltage. Op-amp 604 keeps the potential at its inverting input, connected to the drain of MOSFET 403*a*, equal to (within the error of bias offset voltage $V_{os2}$) the voltage of its non-inverting input, connected to the drain of MOSFET 403*b*. It does so by altering the voltage applied to the gates of the MOSFET 405*a* and MOSFET 405*b* in current mirror 404. In like manner, op-amp 608 controls the drain voltages of MOSFET 405*a* and MOSFET 405*b* in current mirror 404. The drain of MOSFET 405*b* is connected to the non-inverting input of op-amp 608, the drain of MOSFET 405*a* being connected to the inverting input. Op-amp 608 alters the gate voltage of MOSFET 408, which directly impacts the drain voltage of MOSFET 405*a* until it is equal to the drain voltage of MOSFET 405*b*. In an example embodiment of the circuitry shown in FIG. 6, $M_1$=40; $M_2$=100; total gain is 1/4140; current accuracy is 1% over a dynamic range of 5 decades, from 40 micro-amps to 4 amperes.

Although various embodiments have been described using specific terms and devices, such description is for illustrative purposes only. The words used are words of description rather than of limitation. For example, it is to be understood that the term "MOSFET" is use generically herein to include various types of field effect transistors (FETs), e.g. IGFETs and MISFETs and equivalents thereof. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A current sensing and measurement apparatus comprising:

a first current mirror having an input terminal, a high current output terminal, and a mirrored current output terminal;

a second current mirror having an input terminal, a high current output terminal, and a mirrored current output terminal;

a third current mirror having an input terminal, a high current output terminal, and a mirrored current output terminal, wherein the first current mirror, the second current mirror, and the third current mirror comprise n MOSFET current mirrors, each of which has a gain $M_n$, and wherein the mirrored current output terminal of the first current mirror is connected to the input terminal of the second current mirror, and the mirrored current output terminal of the second current mirror is connected to the input terminal of the third current mirror; and a series connection of n−1 MOSFETS coupled to the high current output terminals of adjacent current mirrors, whereby a current $I_{in}$ to be measured is provided by the $n-1^{th}$ MOSFET.

2. A current sensing and measurement apparatus as recited in claim 1 wherein, for each adjacent current mirror, a mirrored current output terminal of a current mirror is coupled to an input terminal of a subsequent current mirror.

3. A current sensing and measurement apparatus as recited in claim 2 wherein, to a first order approximation, a gain factor Gn of the n current mirrors is approximately equal to the product of the individual gains Mn of the n current mirrors.

4. A current sensing and measurement apparatus as recited in claim 3 further comprising a regulator MOSFET coupled to a mirrored current output terminal of the $n^{th}$ current mirror, whereby a mirrored current output $I_m$ is provided.

5. A current sensing and measurement apparatus as recited in claim 3 wherein $I_m$~$I_{in}/G_n$.

* * * * *